(12) United States Patent
Choi et al.

(10) Patent No.: US 10,615,245 B2
(45) Date of Patent: Apr. 7, 2020

(54) DISPLAY DEVICE

(71) Applicant: Samsung Display Co., Ltd., Yongin-Si, Gyeonggi-Do (KR)

(72) Inventors: Ha Young Choi, Cheonan-si (KR); Joon Sam Kim, Hwaseong-si (KR); Wu Hyeon Jung, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/119,940

(22) Filed: Aug. 31, 2018

(65) Prior Publication Data

US 2019/0229174 A1 Jul. 25, 2019

(30) Foreign Application Priority Data

Jan. 25, 2018 (KR) .......................... 10-2018-0009173

(51) Int. Cl.
*H01L 27/32* (2006.01)
(52) U.S. Cl.
CPC ...... *H01L 27/3276* (2013.01); *H01L 27/3223* (2013.01); *H01L 27/3279* (2013.01); *H01L 2251/5392* (2013.01)
(58) Field of Classification Search
CPC ............. H01L 27/3276; H01L 27/3223; H01L 2251/5392; H01L 27/3279
USPC .......................................................... 257/40
See application file for complete search history.

(56) References Cited

U.S. PATENT DOCUMENTS 9,437,551 B2    9/2016  Cheng et al.
2016/0103349 A1*  4/2016  Park .................. G02F 1/133512
                                                        349/42

FOREIGN PATENT DOCUMENTS

| KR | 10-2012-0073765 A | 7/2012 |
|---|---|---|
| KR | 10-2016-0101823 A | 8/2016 |
| KR | 10-1644980 B1 | 8/2016 |
| KR | 10-1669997 | 10/2016 |
| KR | 10-1765656 | 8/2017 |

* cited by examiner

*Primary Examiner* — Tu-Tu V Ho
(74) *Attorney, Agent, or Firm* — Innovation Counsel LLP

(57) ABSTRACT

An exemplary embodiment provides a display device including: a display panel including a pad portion; and a flexible printed circuit film bonded to the pad portion, wherein the pad portion includes lighting pads positioned at a least one end thereof, the flexible printed circuit film includes dummy pads positioned at a portion corresponding to the lighting pads to overlap at least some of the lighting pads, and a number of the dummy pads is smaller than that of the lighting pads.

19 Claims, 17 Drawing Sheets

DISPLAY DEVICE

CROSS-REFERENCE TO RELATED APPLICATION

This application claims priority to and the benefit of Korean Patent Application No. 10-2018-0009173 filed in the Korean Intellectual Property Office on Jan. 25, 2018, the entire contents of which are incorporated herein by reference.

BACKGROUND (a) Technical Field

This disclosure relates to a display device.

(b) Description of the Related Art

A display device such as an organic light emitting diode display and a liquid crystal display is commonly used. The display device includes a display panel including pixels displaying an image. In the display panel, as well as the pixels, a pad portion for input and output of signals used to control an operation of the display panel, and signal lines connected to the pad portion and transmitting the signals, are formed.

A flexible printed circuit film is bonded to a region (pad portion) where the pads are formed to transmit signals to the display panel. The display panel may include lighting pads to be used in a process for checking whether the pixels of the display panel are functioning normally before bonding of the flexible printed circuit film. An anisotropic conductive film (ACF) may be used for electrical connection and physical coupling between the flexible printed circuit film and the pad portion. The anisotropic conductive film is a film in which conductive particles are arranged in an insulating layer such as a resin. The resin of the anisotropic conductive film may be in a pre-cured state, or may be a thermosetting or photo-curing resin that is completely cured in a bonding process.

The number of signals transmitted to the display panel and the number of pads that transmit such signals are required to increase, in order to provide high resolution of the display device. It may be necessary to reduce the pad pitch in order to increase the number of pads.

The above information disclosed in this Background section is only for enhancement of understanding of the background of the invention, and therefore it may contain information that does not form the prior art that is already known in this country to a person of ordinary skill in the art.

SUMMARY

Exemplary embodiments provide a display device capable of preventing occurrence of defects associated with lighting pads.

An exemplary embodiment provides a display device including: a display panel including a pad portion; and a flexible printed circuit film bonded to the pad portion, wherein the pad portion includes lighting pads positioned at at least one end thereof, the flexible printed circuit film includes dummy pads positioned at a portion corresponding to the lighting pads to overlap at least some of the lighting pads, and a number of the dummy pads is smaller than that of the lighting pads.

A pitch of the dummy pads may be greater than that of the lighting pads, and may be twice or more that of the lighting pads.

Among the lighting pads, lighting pads overlapping the dummy pads and lighting pads that do not overlap the dummy pads may be alternately positioned along a first direction corresponding to a longitudinal direction of the pad portion.

The pad portion may include an alignment mark between the lighting pads and pads adjacent thereto.

The flexible printed circuit film may include an alignment mark between the dummy pads and pads adjacent thereto.

The lighting pads may be rectangular and have long sides that are perpendicular to a first direction corresponding to a longitudinal direction of the pad portion. The pads adjacent to the lighting pads may be parallelogrammic and have long sides that are inclined with respect to the first direction.

The dummy pads may be rectangular and have long sides that are perpendicular to the longitudinal direction of the pad portion. The pad adjacent to the dummy pads may be parallelogrammic and have long sides that are inclined with respect to the longitudinal direction of the pad portion.

A width of the lighting pads and a width of the dummy pads may be substantially the same. A length of the lighting pads and a length of the dummy pads may be substantially the same.

The pad portion and the flexible printed circuit film may be bonded to each other by an anisotropic conductive film including conductive particles.

An exemplary embodiment provides a display device including: a display panel including a pad portion; and a flexible printed circuit film bonded to the pad portion, wherein the pad portion includes lighting pads positioned in at least one end thereof, the flexible printed circuit film includes dummy pads corresponding to the lighting pads, and the dummy pads are arranged in at least two rows.

A number of the dummy pads may be a same number as that of the lighting pads.

Each of the lighting pads may include a relatively wide first portion and a relatively narrow second portion, and the dummy pads may overlap the first portions of the lighting pads.

The first portions and the second portions of the lighting pads are alternately positioned along a first direction corresponding to a longitudinal direction of the pad portion.

A length of each of the first portions may be shorter than that of each of the second portions.

A width of each of the first portions and a width of each of the dummy pads may be substantially the same. A length of each of the first portions and a length of each of the dummy pads may be substantially the same.

The dummy pads may include dummy pads positioned at a first row and dummy pads positioned at a second row, a pitch of the dummy pads positioned at the first row may be the same as that of the dummy pads positioned at the second row, and the pitch of the dummy pads positioned at the first row may be twice the pitch of the lighting pads.

Some of the lighting pads may include a relatively wide first portion and a relatively narrow second portion, others of the lighting pads may include the first portion but include no second portion, and the dummy pads may overlap the first portions of the lighting pads.

According to the exemplary embodiments, the flow passage of the anisotropic conductive film may be expanded when it is pressed for bonding of the flexible printed circuit film, thereby preventing a short circuit of the lighting pads caused by the conductive particles. As a result, it is possible to prevent defects of the display device.

DETAILED DESCRIPTION OF THE EMBODIMENTS

Figure 1:
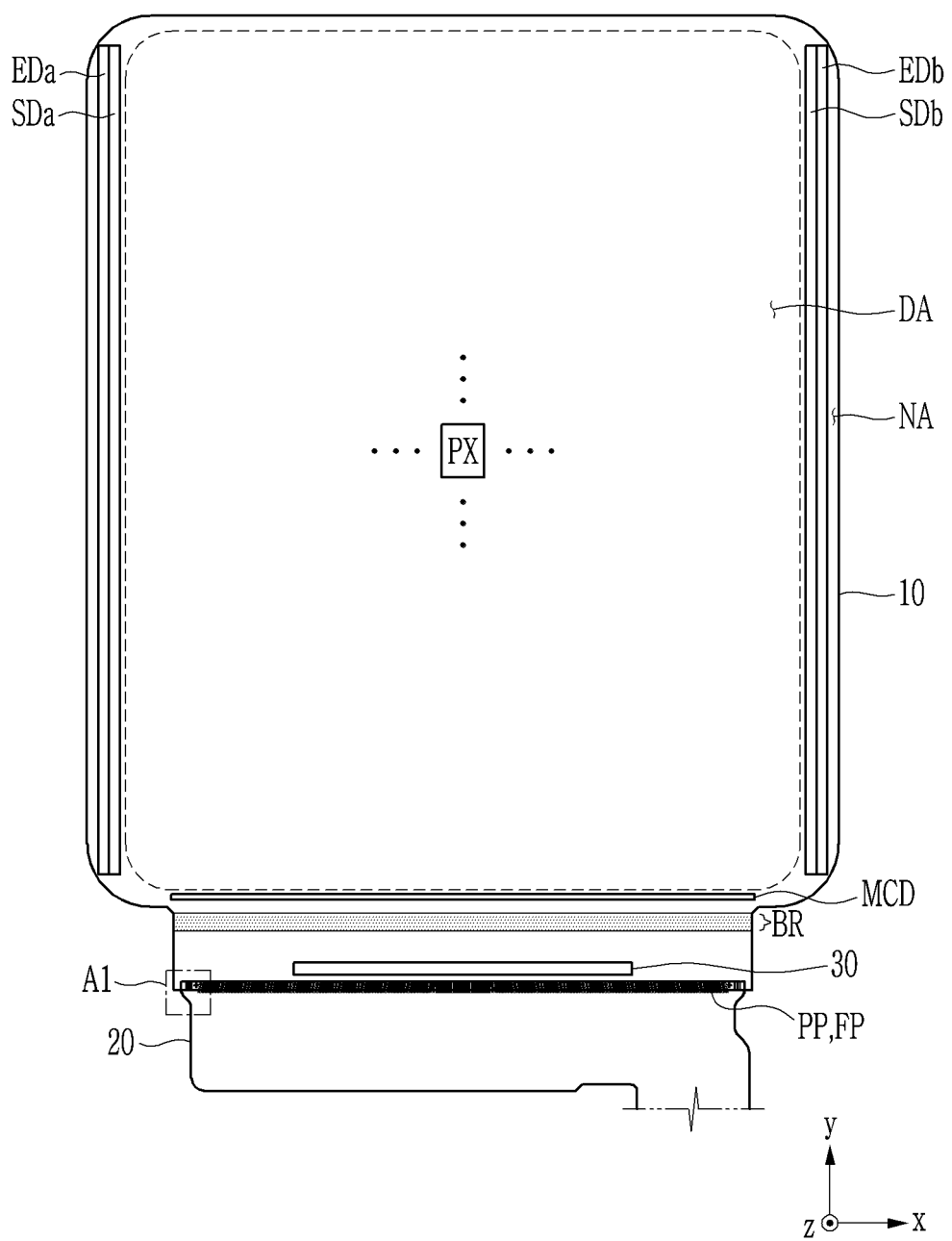
FIG. 1 is a top plan view of a display device according to an exemplary embodiment.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

To clearly describe the present inventive concept, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

A display device according to an exemplary embodiment of the present inventive concept will now be described in detail with reference to the accompanying drawings. Hereafter, an organic light emitting diode (OLED) display as the display device will be exemplarily described, but the present inventive concept is not limited thereto, and may be applicable to other display devices.

Figure 2:
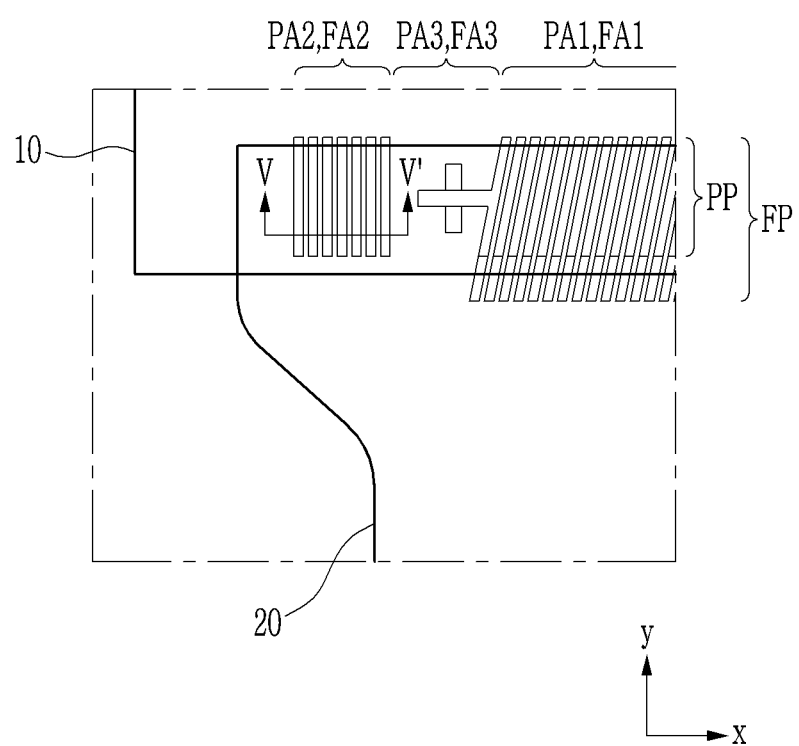
FIG. 2 is an enlarged view illustrating a region A1 in FIG. 1.
Figure 3:
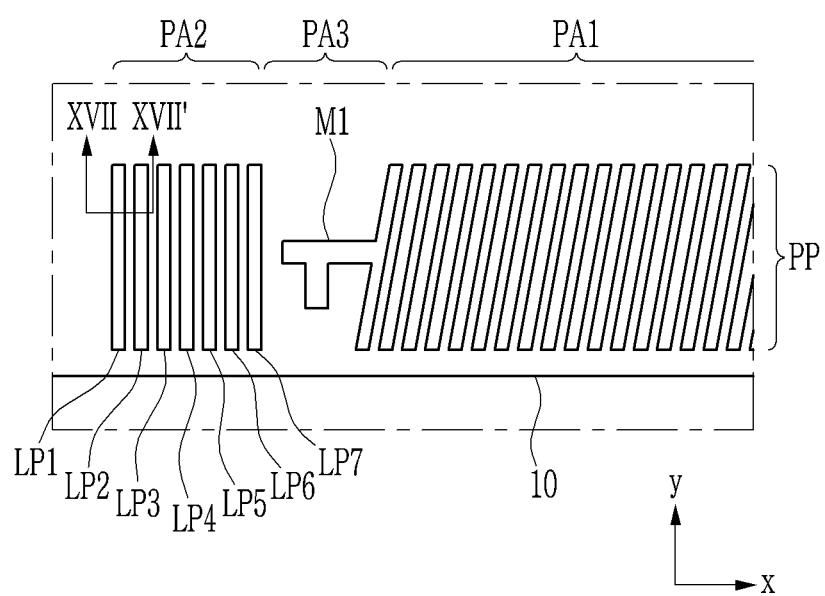
FIG. 3 is an enlarged view illustrating the display panel illustrated in FIG. 2 according to an exemplary embodiment.
Figure 4:
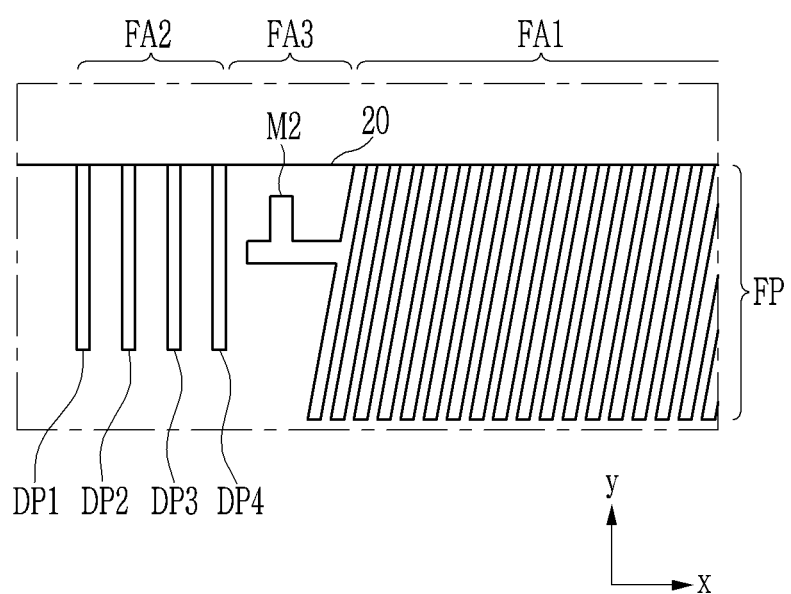
FIG. 4 is an enlarged view illustrating a flexible printed circuit film illustrated in FIG. 2 according to an exemplary embodiment.
Figure 5:
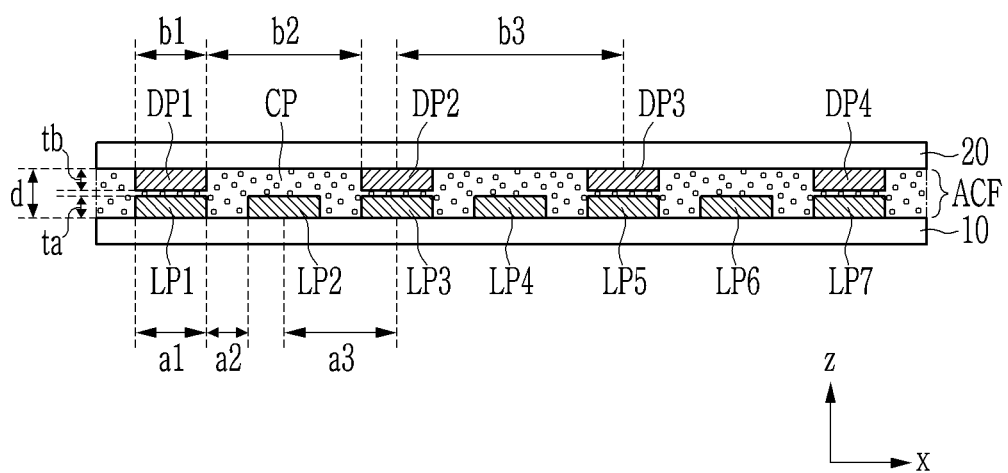
FIG. 5 is a cross-sectional view taken along line V-V' in FIG. 2 according to an exemplary embodiment.

FIG. 1 is a top plan view of a display device according to an exemplary embodiment, and FIG. 2 is an enlarged view illustrating a region A1 in FIG. 1. FIG. 3 is an enlarged view illustrating the display panel illustrated in FIG. 2 according to an exemplary embodiment, FIG. 4 is an enlarged view illustrating a flexible printed circuit film illustrated in FIG. 2 according to an exemplary embodiment, and FIG. 5 is a cross-sectional view taken along line V-V' in FIG. 2 according to an exemplary embodiment.

Referring to FIG. 1, the display device includes a driving unit configured to include a display panel 10, a flexible printed circuit film 20 bonded to the display panel 10, an integrated circuit chip 30, and the like.

The display panel 10 includes a display area DA corresponding to a screen on which images are displayed, and a non-display area NA positioned around the display area DA. Circuits and/or signal lines for generating and/or transferring various signals that apply to the display area DA are disposed in the non-display area NA. In FIG. 1, the inside and the outside of the dotted-line rectangle with rounded corners correspond to the display area DA and the non-display area NA, respectively.

The pixels PX are disposed in, e.g., a matrix form in the display area DA of the display panel 10. Scan lines (also referred to as gate lines), emission control lines, data lines, and signal lines (not illustrated) such as driving voltage lines are also disposed in the display area DA. A scan line, an emission control line, a data line, and a driving voltage line may be connected with each pixel PX to receive a scan signal (or gate signal), an emission control signal, a data signal, and a driving voltage ELVDD.

A pad portion PP at which pads for receiving signals from the outside of the display panel 10 are formed is positioned in the display panel 10 of the non-display area NA. The pad portion PP is positioned to extend along an edge of the display panel 10 in a first direction x. Accordingly, a longitudinal direction of the pad portion PP may be the same as the first direction x. The flexible printed circuit film 20 may be bonded to the pad portion PP, and pads or bumps of the flexible printed circuit film 20 may be electrically connected to the pads of the pad portion PP. An anisotropic conductive film including conductive particles may be used for bonding of the flexible printed circuit film 20 and electrical connection between the pads.

A driving unit for generating and/or processing various signals for driving the display panel 10 is positioned in the display panel 10 of the non-display area NA. The driving unit may include a data driver for applying data signals to the data lines, scan drivers SDa and SDb for applying scan signals to the scan lines, emission drivers EDa and EDb for applying emission control signals to the emission control lines, and a signal controller for controlling the scan drivers SDa and SDb and the emission drivers EDa and EDb.

The scan drivers SDa and SDb and the emission drivers EDa and EDb are integrated in the display panel 10. The scan drivers SDa and SDb may be positioned at a left side and a right side of the display area DA, respectively. The emission drivers EDa and EDb may also be positioned at a left side and a right side of the display area DA, respectively. The scan drivers SDa and SDb and/or the emission drivers EDa and EDb may alternatively be positioned at only one of the left side and the right side of the display area DA. Alternatively, they may be positioned at an upper side or a lower side of the display area DA.

The data driver and the signal controller may be provided in the integrated circuit chip (also referred to as a driving IC chip) 30, and the integrated circuit chip 30 may be mounted in the non-display area NA of the display panel 10. The integrated circuit chip 30 may be electrically connected to the display panel 10 in the form of a tape carrier package (TCP).

A crack detection circuit MCD may be located in the non-display area NA of the display panel 10. The crack detection circuit MCD may include transistors and may be used to check cracks, etc., occurring in the display panel 10.

A lighting circuit that can be used to check lighting of the pixels PX may be positioned in the non-display area NA of the display panel 10. The lighting circuit may overlap the integrated circuit chip 30, for example.

The display panel 10 may include a bending region BR. For example, the bending region BR may be positioned in the non-display area NA between the display area DA and the pad portion PP. The bending region BR may be positioned across the display panel 10 in the first direction x. The display panel 10 is bent in the bending area BR so that the pad portion PP farther from the display area DA than the bending region BR may be positioned behind the display area DA.

Referring to FIG. 2 to FIG. 5, a left edge portion of the pad portion PP is illustrated. A right edge portion of the pad portion PP may be symmetrical with the left edge portion with respect to a central axis of the display panel 10 in a longitudinal direction (corresponding to the second direction y). FIG. 3 illustrates only the display panel 10, and FIG. 4 illustrates only the flexible printed circuit film 20, in order to clearly show a structure and disposal of the pads.

The pad portion PP of the display panel 10 includes a first pad region PA1 positioned at a center of the pad portion PP to occupy most of the pad portion PP, a second pad region PA2 positioned at opposite ends of the pad portion PP, and a third pad region PA3 positioned between the first pad region PA1 and the second pad region PA2.

Driving pads for receiving signals such as a power signal for driving the display panel 10, a clock signal, an image signal, and the like are positioned in the first pad region PA1. The driving pads, illustrated as an elongated parallelogram, are arranged substantially in parallel with each other in the first direction x. The driving pads are slightly inclined with respect to the first direction x and the second direction y. However, the driving pads positioned at a central portion of the first pad region PA1 may have long sides that are rectangular or nearly rectangular parallel to the second direction y, and may be gradually inclined from the central portion of the first pad region PA1 toward a peripheral portion thereof. An inclined direction and degree of the driving pads may be symmetrical about a central axis of the second direction y of the first pad region PA1.

Lighting pads LP1 to LP7 are positioned in the second pad region PA2. The lighting pads LP1 to LP7 may be pads used in an inspection process of the display panel 10 before the bonding of the flexible printed circuit film 20 and before the mounting of the integrated circuit chip 30. Signals that are used for driving the display panel 10 during the checking of the pixels PX may be inputted into the lighting pads LP1 to LP7. For example, the lighting pads LP1 to LP7 may respectively receive a scan frame signal FLM, a second scan clock signal CLK2, an emission frame signal ACL_FLM, a first scan clock signal CLK1, a second emission clock signal EM_CLK2, a first emission clock signal EM_CLK1, and a crack detection gate signal MCD_GATE.

The first and second scan clock signals CLK1 and CLK2 and the scan frame signal FLM are signals used to drive the scan driver SDa, the first and second emission clock signals EM_CLK1 and EM_CLK2 and the emission frame signal ACL_FLM are signals used to drive the emission driver EDa, and the crack detection gate signals MCD_GATE are signals used to drive the crack detection circuit MCD.

In further detail, the first and second scan clock signals CLK1 and CLK2 are transferred to the scan driver SDa to be used to generate scan signals. The scan frame signal FLM is transferred to the scan driver SDa to indicate the start of one frame for inputting the scan signals to the display area DA. The scan frame signal FLM may be referred to as a scan start pulse signal. The first and second emission clock signals EM_CLK1 and EM_CLK2 are transferred to the emission driver Eda to be used to generate emission control signals. The emission frame signal ACL_FLM is transferred to the emission driver EDa to indicate the start of one frame for inputting the emission control signal into the display area DA. The emission frame signal ACL_FLM may be referred to as an emission start pulse signal. The crack detection gate signal MCD_GATE may be used to turn on the transistors of the crack detection circuit MCD.

These signals can be generated and outputted by the integrated circuit chip 30, but cannot be supplied from the integrated circuit chip 30 in an inspection process before the integrated circuit chip 30 is provided. Thus, these signals may be externally inputted through the lighting pads LP1 to LP7 in the inspection process.

The lighting pads LP1 to LP7 are arranged substantially in parallel with each other in the first direction x. The lighting pads LP1 to LP7 are rectangular, and long sides thereof are perpendicular to the first direction x. The lighting pads LP1 to LP7 may be formed to have a same width a1 and a same interval a2, and a pitch a3 of the lighting pads LP1 to LP7 may correspond to a sum of the width a1 and the interval a2 of the lighting pads LP1 to LP7. For example, the width a1 of the lighting pads LP1 to LP7 may be about 51 μm, the interval a2 may be about 19 μm, and the pitch a3 may be about 70 μm. The pitch a3 of the lighting pads LP1 to LP7 may be smaller than that of the driving pads positioned in the first pad region PA1.

The scan driver SDb and the emission driver EDb positioned at a right side of the display area DA may receive the aforementioned signals through the lighting pads disposed in the second pad region positioned at a right-side end of the pad portion PP. A correspondence relationship between the lighting pads LP1 to LP7 of the inputted signals and types of the signals may be variously changed. Although 7 lighting pads LP1 to LP7 are illustrated therein, the pad portion PP may include fewer than seven lighting pads depending on the design.

An alignment mark M1 is positioned in the third pad region PA3. The alignment mark M1 may be used to accurately align the flexible printed circuit film 20 when the flexible printed circuit film 20 is bonded. The alignment mark M1 may be used to accurately align a probe of an inspection apparatus with the pad portion PP of the display panel 10 in automatic visual inspection (AVI). The alignment mark M1 may be recognized by a sensor (e.g., a camera) such as an inspection apparatus. The alignment mark M1 may be connected with a driving pad thereto.

The flexible printed circuit film 20 may include a pad portion FP corresponding to the pad portion PP of the display panel 10. The pad portion FP of the flexible printed circuit film 20 covers the pad portion PP of the display panel 10.

The pad portion FP includes a first pad region FA1 corresponding to the first pad region PA1 of the pad portion PP, a second pad region FA2 corresponding to the second pad region PA2 of the pad portion PP, and a third pad region FA3 corresponding to the third pad region PA3 of the pad portion PP.

Pads that may correspond to the driving pads of the pad portion PP and may be electrically connected to the driving pads through the conductive particles CP are positioned in the first pad region FA1. The pads may have a shape and a slope corresponding to the drive pads. The pads may be formed longer than the driving pads.

Dummy pads DP1 to DP4 corresponding to the lighting pads LP1 to LP7 of the pad portion PP are positioned in the second pad region FA2. The lighting pads LP1 to LP7 are intended to receive no signal after the flexible printed circuit film 20 is bonded. For example, the lighting pads LP1 to LP7 are pads used for inputting signals for inspecting the display panel 10 before the flexible printed circuit film 20 is bonded and are not used in the display device in which the printed circuit film 20 is bonded.

Accordingly, the flexible printed circuit film 20 is not required to include pads corresponding to the lighting pads LP1 to LP7. However, a problem may occur when an anisotropic conductive film ACF is positioned between the pad portion PP and the pad portion FP, for example, and is pressed by using a pressing tool of a bonding machine.

Specifically, if the flexible printed circuit film 20 includes no dummy pads DP1 to DP4 corresponding to the lighting pads LP1 to LP7, a gap between the display panel 10 and the flexible printed circuit film 20 may be narrowed when the flexible printed circuit film 20 is pressed, so that a flow passage of the anisotropic conductive film ACF (i.e., a passage through which a resin that is in a pre-cured state and is more than an amount that can fill the gap between the display panel 10 and the flexible printed circuit film 20, and the conductive particles CP contained therein can escape) may not be sufficiently secured. As a result, since the conductive particles CP may not sufficiently escape between the lighting pads LP1 to LP7 and may accumulate at end portions of the lighting pads LP1 to LP7, a short circuit may occur between the lighting pads LP1 to LP7. This can lead to poor display of horizontal lines on the screen.

Referring to FIG. 5, the gap d between the display panel 10 and the flexible printed circuit film 20 may be approximately increased by a thickness tb of the dummy pads DP1 to DP4 by forming the dummy pads DP1 to DP4 corresponding to the lighting pads LP1 to LP7. As a result, a flow space of the anisotropic conductive film ACF may be expanded to prevent aggregation of the conductive particles CP and a short circuit between the lighting pads LP1 to LP7. The thickness to of the lighting pads LP1 to LP7 may be about 5 to 10 μm, and the thickness tb of the dummy pads DP1 to DP4 may be about 15 to 30 μm. The conductive particles CP may have a diameter that is in a range of about 2 to 7 μm, or 4 to 6 μm.

The dummy pads DP1 to DP4 may not correspond one to one with the lighting pads LP1 to LP7. In other words, a number of the dummy pads DP1 to DP4 is smaller than that of the lighting pads LP1 to LP7. In the illustrated exemplary embodiment, the four lighting pads LP1, LP3, LP5, and LP7 are paired and overlapped with the dummy pads DP1 to DP4, respectively, but no dummy pads correspond to the three lighting pads LP2, LP4, and LP6. As such, when the dummy pads DP1 to DP4 are formed to have a number thereof that is smaller than that of the lighting pads LP1 to LP7, it is possible to secure a wider flow passage of an anisotropic conductive film ACF (corresponding to a space between the display panel 10 and the flexible printed circuit film 20 filled with the anisotropic conductive film ACF in FIG. 5) while maintaining the gap between the display panel 10 and the flexible printed circuit film 20. Thus, it is possible to more effectively prevent the accumulation of the conductive particles CP.

It may be difficult to form the dummy pads DP1 to DP4 at a pitch corresponding to the pitch a3 of the lighting pads LP1 to LP7. For example, it may be difficult to form the dummy pads DP1 to DP4 at a pitch that is equal to or smaller than about 100 μm or with a width that is equal to or smaller than about 50 μm. Accordingly, the pitch of the lighting pads LP1 to LP7 may be required to increase in order to form the dummy pads DP1 to DP4 in the same number as the lighting pads LP1 to LP7, thereby increasing the width of the pad portion PP. In addition, when the dummy pads DP1 to DP4 are formed in the same number as the lighting pads LP1 to LP7, a short circuit of the lighting pads LP1 to LP7 may occur by the dummy pads DP1 to DP4. Accordingly, the number of dummy pads DP1 to DP4, which is smaller than the number of the lighting pads LP1 to LP7, may facilitate not only securing a wider flow passage but also increasing the width of the pad portion PP and preventing occurrence of a short circuit of the lighting pads LP1 to LP7. In FIG. 5, the pitch b3 of the dummy pads DP1 to DP4 is twice the pitch a3 of the lighting pads LP1 to LP7. In this case, when the width a1 of the lighting pads LP1 to LP7 is about 51 μm and the pitch a3 thereof is about 70 μm, a width of the flow passage may be expanded from about 19 μm (the dummy pads DP1 to DP4 are not provided) to about 89 μm.

The dummy pads DP1 to DP4 are arranged substantially in parallel with each other in the first direction x. The dummy pads DP1 to DP4 are rectangular, and long sides thereof are perpendicular to the first direction x and are in parallel with the second direction y. The dummy pads DP1 to DP4 may have shapes and sizes corresponding to those of the lighting pads LP1 to LP7. The dummy pads DP1 to DP4 may have substantially the same size as the lighting pads LP1 to LP7. In this specification, "substantially the same" may indicate being within a ±10% range.

The dummy pads DP1 to DP4 may be formed to have a same width b1 and a same interval b2, and a pitch b3 of the dummy pads DP1 to DP4 may correspond to a sum of the width b1 and the interval b2 of the dummy pads DP1 to DP4. The width b1 of the dummy pads DP1 to DP4 may be substantially the same as the width of the lighting pads LP1 to LP7, and a length of the dummy pads DP1 to DP4 may be substantially the same as a length of the lighting pads LP1 to LP7. However, the width b1 of the dummy pads DP1 to DP4 may be smaller than or greater than the width a1 of the lighting pads LP1 to LP7. However, when the width b1 of the dummy pads DP1 to DP4 is not greater than the width a1 of the lighting pads LP1 to LP7, a possibility of a short circuit is reduced even if an alignment error occurs. This is because, when the width b1 of the dummy pads DP1 to DP4 is greater than the width a1 of the lighting pads LP1 to LP7, the dummy pads DP1 to DP4 may be connected to adjacent lighting pads LP1 to LP7 directly or through the conductive particles CP. Thus, it may be advantageous for the width of the dummy pads DP1 to DP4 to be equal to or smaller than the width of the lighting pads LP1 to LP7.

An alignment mark M2 is positioned in the third pad region FA3. The alignment mark M2 of the pad portion FP may be aligned with the alignment mark M1 of the pad portion PP to form a cross in a plan view as shown in FIG. 2. The alignment mark M2 may be connected with a pad adjacent thereto (a pad in the first region FA1).

The pitch b3 of the dummy pads DP1 to DP4 may be an integral multiple of the pitch a3 of the lighting pads LP1 to LP7. In addition, even when the dummy pads DP1 to DP4 are formed at the same pitch b3, the corresponding lighting pads LP1 to LP7 may be different. The differences will be mainly described with reference to FIG. 6 and FIG. 7. Hereinafter, the drawings described previously will be further described with reference thereto.

Figure 6:
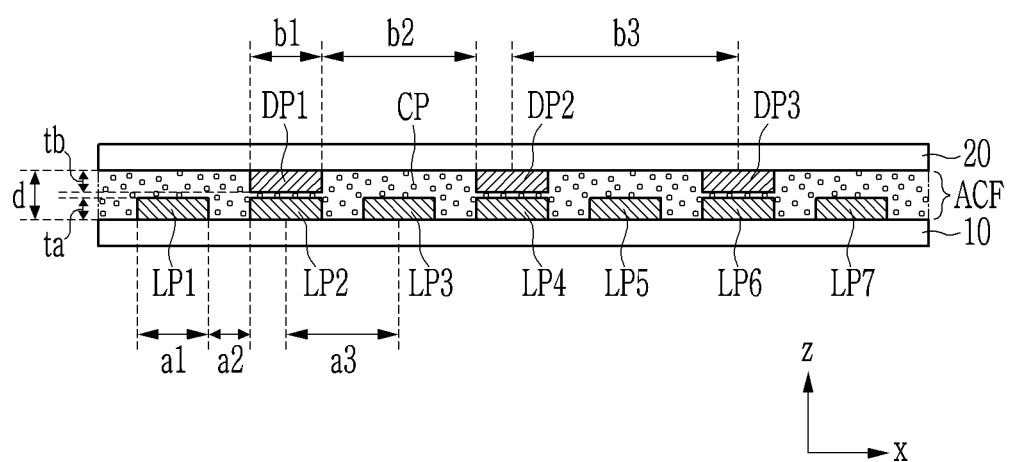
FIG. 6 and FIG. 7 are cross-sectional views taken along line V-V' in FIG. 2 according to an exemplary embodiment.
Figure 7:
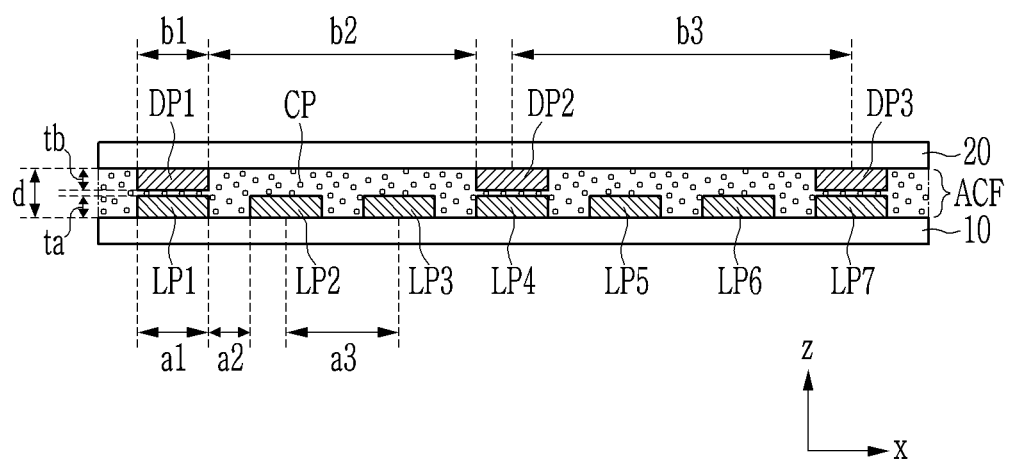

FIG. 6 and FIG. 7 are cross-sectional views taken along line V-V' in FIG. 2 according to an exemplary embodiment.

Referring to FIG. 6, the lighting pads LP1 to LP7 are the same as those of the exemplary embodiment of FIG. 5. However, the exemplary embodiment of FIG. 6 is different from the exemplary embodiment of FIG. 5 in positions of the dummy pads DP1 to DP3. Specifically, in FIG. 5, the dummy pad D1 corresponds to the lighting pad LP1 located at an outermost position of the pad portion PP, while in FIG. 6, the dummy pad D1 corresponds to the lighting pad LP2 adjacent to the lighting pad LP1. The pitch b3 of the dummy pads DP1 to DP3 is twice the pitch a3 of the lighting pads LP1 to LP7. In such disposal, when 7 lighting pads LP1 to LP7 are provided, 3 dummy pads DP1 to DP3 may be provided.

Referring to FIG. 7, the dummy pad D1 corresponds to the lighting pad LP1 located at an outermost position of the pad portion PP, while the pitch b3 of the dummy pads DP1 to DP3 is three times the pitch of the lighting pads LP1 to LP7. In such disposal, when 7 lighting pads LP1 to LP7 are provided, 3 dummy pads DP1 to DP3 may be provided.

In the exemplary embodiments of FIG. 5, FIG. 6, and FIG. 7, the dummy pads are arranged at the same interval a2. However, the present inventive concept is not limited thereto, and the dummy pads may be arranged at different intervals. For example, in FIG. 5, the dummy pad DP3 may be positioned to correspond to the lighting pad LP6, and the dummy pad DP4 may be omitted. As such, the dummy pads positioned in the second region FA2 of the flexible printed circuit film 20 may be variously arranged to expand the flow passage of the anisotropic conductive film ACF when the flexible printed circuit film 20 is pressed.

In the exemplary embodiments described so far, the lighting pads LP1 to LP7 of the pad portion PP of the display panel 10 are arranged in a line to have the same size, and the dummy pads DP1 to DP4 of the pad portion FP of the flexible printed circuit film 20 are also arranged in a line to have the same size. However, the lighting pads LP1 to LP7 may be arranged in different sizes or arranged in a plurality of columns, and the dummy pads DP1 to DP4 may also be arranged in different sizes or arranged in a plurality of columns. Several exemplary embodiments will be described with reference to FIG. 8 to FIG. 13, focusing on differences from the aforementioned exemplary embodiments.

Figure 8:
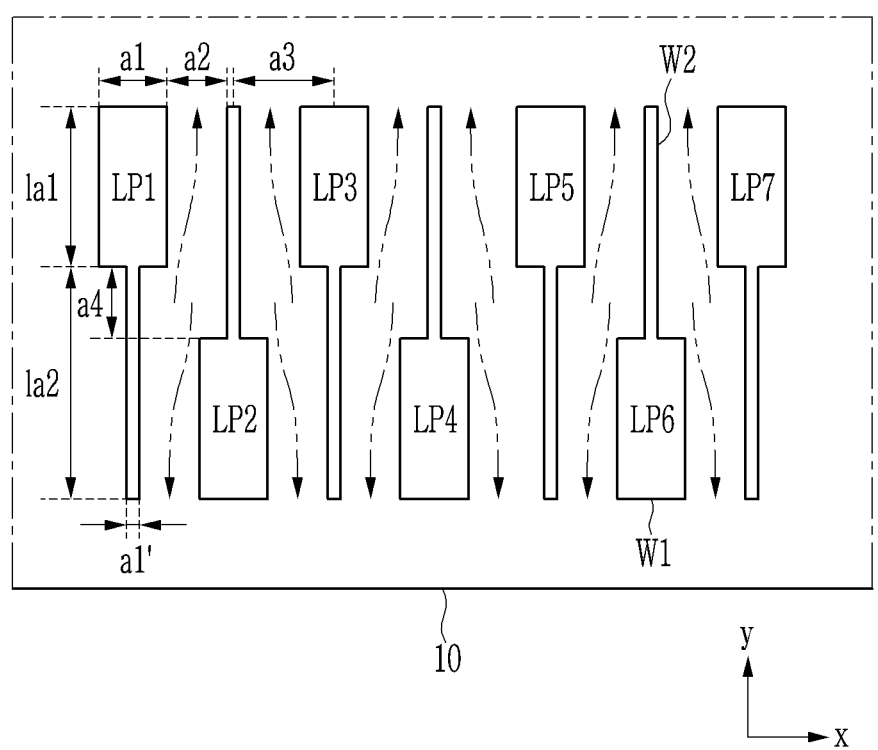
FIG. 8 and FIG. 9 are top plan views respectively illustrating lighting pads of a display panel and dummy pads of a flexible printed circuit film according to an exemplary embodiment.
Figure 9:
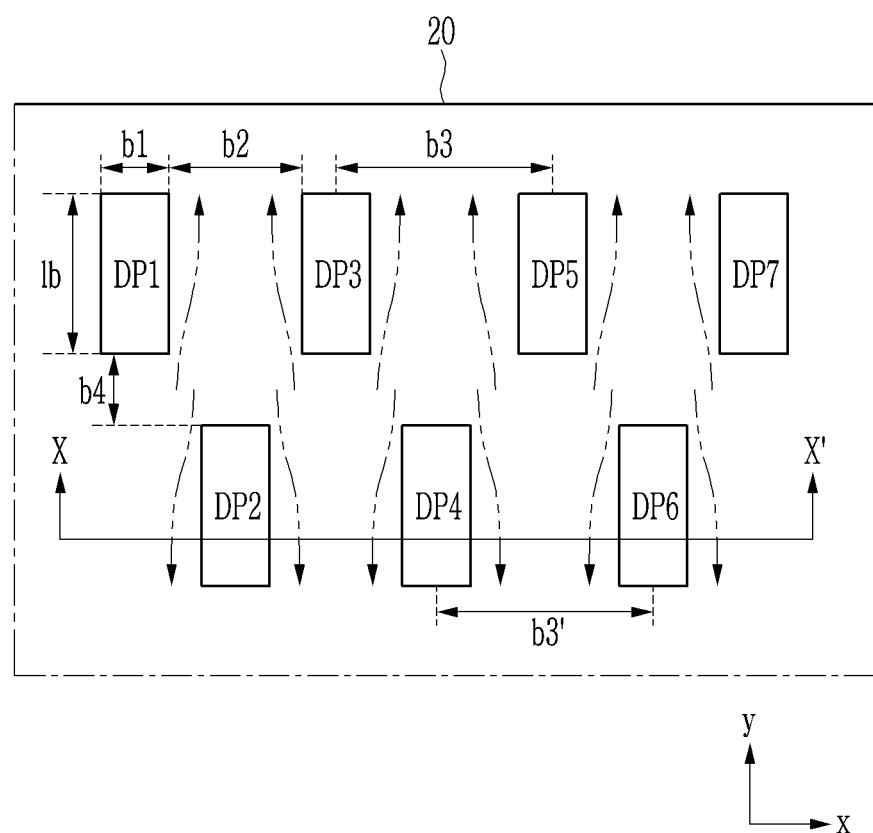

FIG. 8 and FIG. 9 are top plan views respectively illustrating lighting pads of a display panel and dummy pads of a flexible printed circuit film according to an exemplary embodiment.

Figure 10:
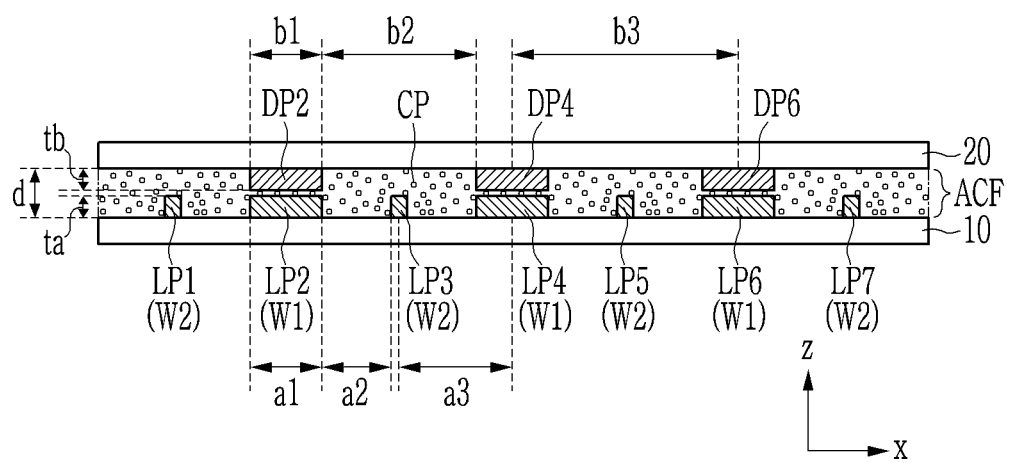
FIG. 10 is a cross-sectional view taken along line X-X' in FIG. 9.

The lighting pads LP1 to LP7 and the dummy pads DP1 to DP7 are respectively illustrated in FIG. 8 and FIG. 9 so as to clearly show structures and disposals of the lighting pads LP1 to LP7 and the dummy pads DP1 to DP7. FIG. 10 illustrates a cross-section in a state where the flexible printed circuit film 20 is bonded to the pad portion PP of the display panel 10. Portions illustrated therein correspond to the second pad regions PA2 and FA2 in FIG. 2. In FIG. 8 and FIG. 9, double-dot chain line arrows indicate an approximate flow direction of the anisotropic conductive film ACF.

Referring to FIG. 8, each of the lighting pads LP1 to LP7 includes a wide first portion W1 and a narrow second portion W2. In the lighting pads LP1, LP3, LP5, and LP7, the first portion W1 is positioned at an upper portion thereof. In the lighting pads LP2, LP4, and LP6, the first portion W1 is positioned at a lower portion thereof (closer to an edge of the display panel 10. The lighting pads LP1 to LP7 are positioned such that the first portion W1 and the second portion W2 alternate one by one. Accordingly, the first portion W1 of the lighting pad LP1 and the second portion W2 of the lighting pad LP2 overlap each other in the first direction x, and the second portion W2 of the lighting pad LP1 and the first portion W1 of the lighting pad LP2 overlap each other in the first direction x. As a result, the interval a2 between the adjacent lighting pads LP1 to LP7 may be widened to expand the flow passage of the anisotropic conductive film ACF.

When the pitch a3 of the lighting pads LP1 to LP7 and the width a1 of the first portion W1 are respectively designed to be about 70 μm and 51 μm, a width a1' of the second portion W2 may be in a range of about 3 to 20 μm, and the interval a2 of the lighting pads LP1 to LP7 may be in a range of about 34 to 43 μm.

A length la2 of the second portion W2 is longer than a length la1 of the first portion W1. As such, the length la2 of the second portion W2 is increased, an interval a4 is formed between the first portions W1 of the adjacent lighting pads LP1 to LP7.

The anisotropic conductive film ACF may flow at the interval a4 so as to expand the flow passage. The interval a4 may be about 30 μm or more in order to sufficiently expand the flow passage.

Referring to FIG. 9, dummy pads DP1 to DP7 corresponding to the lighting pads LP1 to LP7 are illustrated. The dummy pads DP1-DP7 are arranged in two rows. A first row that is an upper row of dummy pads DP1, DP3, DP5, and DP7 respectively correspond to the first portions W1 of the lighting pads LP1, LP3, LP5, and LP7, and a second row that is a lower row of dummy pads DP2, DP4, and DP6 respectively correspond to the first portions W1 of the lighting pads LP2, LP4, and LP6. As a result, the dummy pads DP1 to DP7 may correspond one to one with the first portions W1 of the lighting pads LP1 to LP7. When 7 lighting pads LP1 to LP7 are provided, 7 dummy pads DP1 to DP7 may be provided.

Referring to FIG. 8, FIG. 9, and FIG. 10, the lighting pads LP1 to LP7 include the first portion W1 and the second portion W2 having different widths a1 and a1', but the dummy pads DP1 to DP7 have the same width b1. The width b1 of the dummy pads DP1 to DP7 may be substantially the same as the width a1 of the first portion W1 of the lighting pads LP1 to LP7. The length 1b of the dummy pads DP1 to DP7 may be substantially the same as the length la1 of the first portion W1 of the lighting pads LP1 to LP7. An interval b4 between the upper row of dummy pads DP1, DP3, DP5, and DP7 and the lower row of dummy pads DP2, DP4, and DP6 may be substantially the same as an interval a4 between the first portions W1 of the lighting pads LP1 to LP7 adjacent thereto. The pitch b3 of the upper row of dummy pads DP1, DP3, DP5, and DP7 is the same as the pitch b3' of the lower row of dummy pads DP2, DP4, and DP6, and is twice the pitch a3 of the lighting pads LP1 to LP7. Thus, in the case of error-free alignment, the dummy pads DP1 to DP7 may completely overlap the first portion W1 of the lighting pads LP1 to LP7.

As such, as in the aforementioned exemplary embodiments, the gap d between the display panel 10 and the flexible printed circuit film 20 may be increased substantially by the thickness tb of the dummy pads DP1 to DP7 by forming and disposing the lighting pads LP1 to LP7 and the dummy pads DP1 to DP7. In addition, the interval a2 between the lighting pads LP1 to LP7 may be widened. Therefore, the flow passage of the anisotropic conductive film ACF may be expanded.

Figure 11:
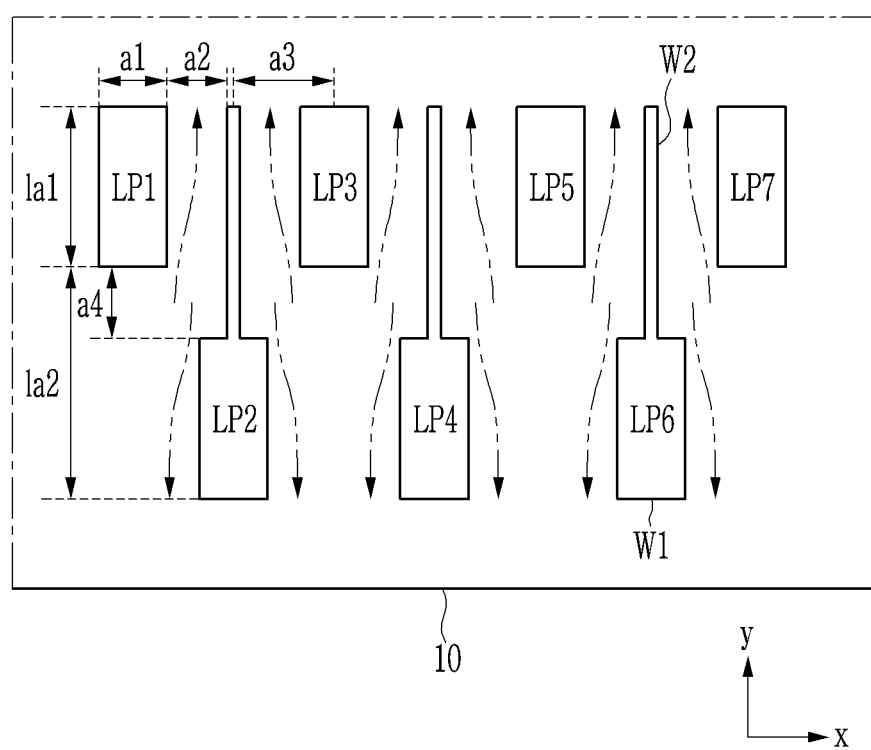
FIG. 11 and FIG. 12 are top plan views respectively illustrating lighting pads of a display panel and dummy pads of a flexible printed circuit film according to an exemplary embodiment.
Figure 12:
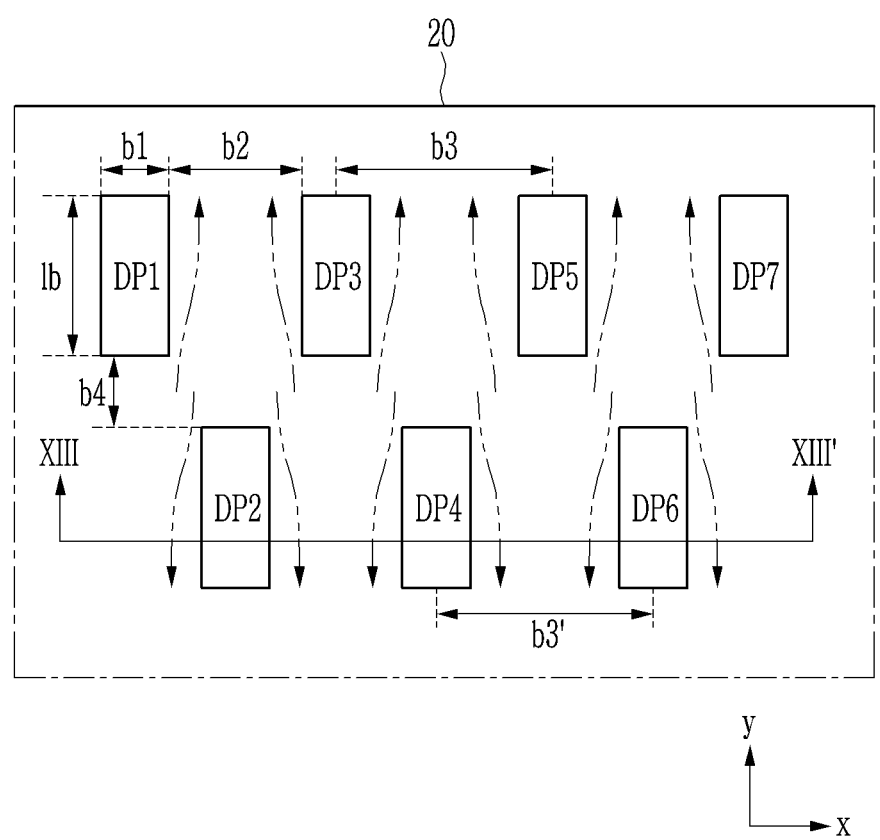

FIG. 11 and FIG. 12 are top plan views respectively illustrating lighting pads of a display panel and dummy pads of a flexible printed circuit film according to an exemplary embodiment.

Figure 13:
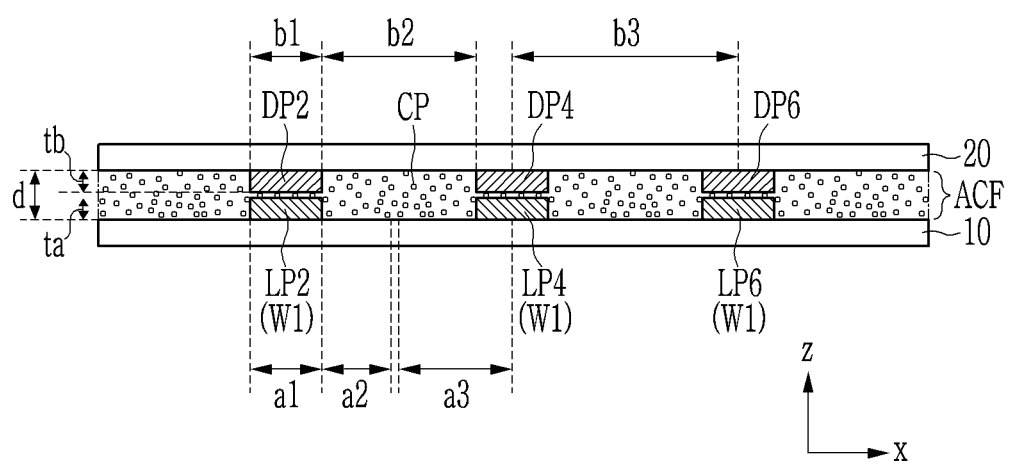
FIG. 13 is a cross-sectional view taken along line XIII-XIII' in FIG. 12.

The lighting pads LP1 to LP7 and the dummy pads DP1 to DP7 are respectively illustrated in FIG. 11 and FIG. 12 so as to clearly show structures and disposals of the lighting pads LP1 to LP7 and the dummy pads DP1 to DP7. FIG. 13 illustrates a cross-section in a state where the flexible printed circuit film 20 is bonded to the pad portion PP of the display panel 10. In FIG. 11 and FIG. 12, double-dot chain line arrows indicate an approximate flow direction of the anisotropic conductive film ACF.

Referring to FIG. 11 to FIG. 13, the present exemplary embodiment is different from the exemplary embodiment of FIG. 8 to FIG. 10 in that each of the lighting pads LP1, LP3, LP5, and LP7 includes a first portion W1 having a wide width but does not include a second portion W2 having a narrow width. As such, as shown in FIG. 13, the flow passage of the anisotropic conductive film ACF may be further expanded in regions corresponding to the lower row of dummy pads DP2, DP4, and DP6 by forming the lighting pads LP1 to LP7 as such. The first portion W1 of the lighting pads LP1, LP3, LP5, and LP7 which do not include the second portion W2 may be positioned farther from a lower edge of the display panel than the first portion W1 of the lighting pads LP2, LP4, and LP6 which include the second portion W2.

Although not illustrated, the lighting pads LP2, LP4, and LP6 may only include a first portion W1 having a wide width in an additional exemplary embodiment. In this case, similar to the dummy pads DP1 to DP7, the lighting pads LP1 to LP7 are arranged in two rows, and the dummy pads DP1 to DP7 may correspond one to one with the lighting pads LP1 to LP7 to completely overlap them.

Hereinafter, a display device according to an exemplary embodiment will be described focusing on pixels of the display area DA with reference to FIG. 14 to FIG. 16. FIG. 1 or other figures will also be referred to in order to describe relationships with other constituent elements of the display device.

Figure 14:
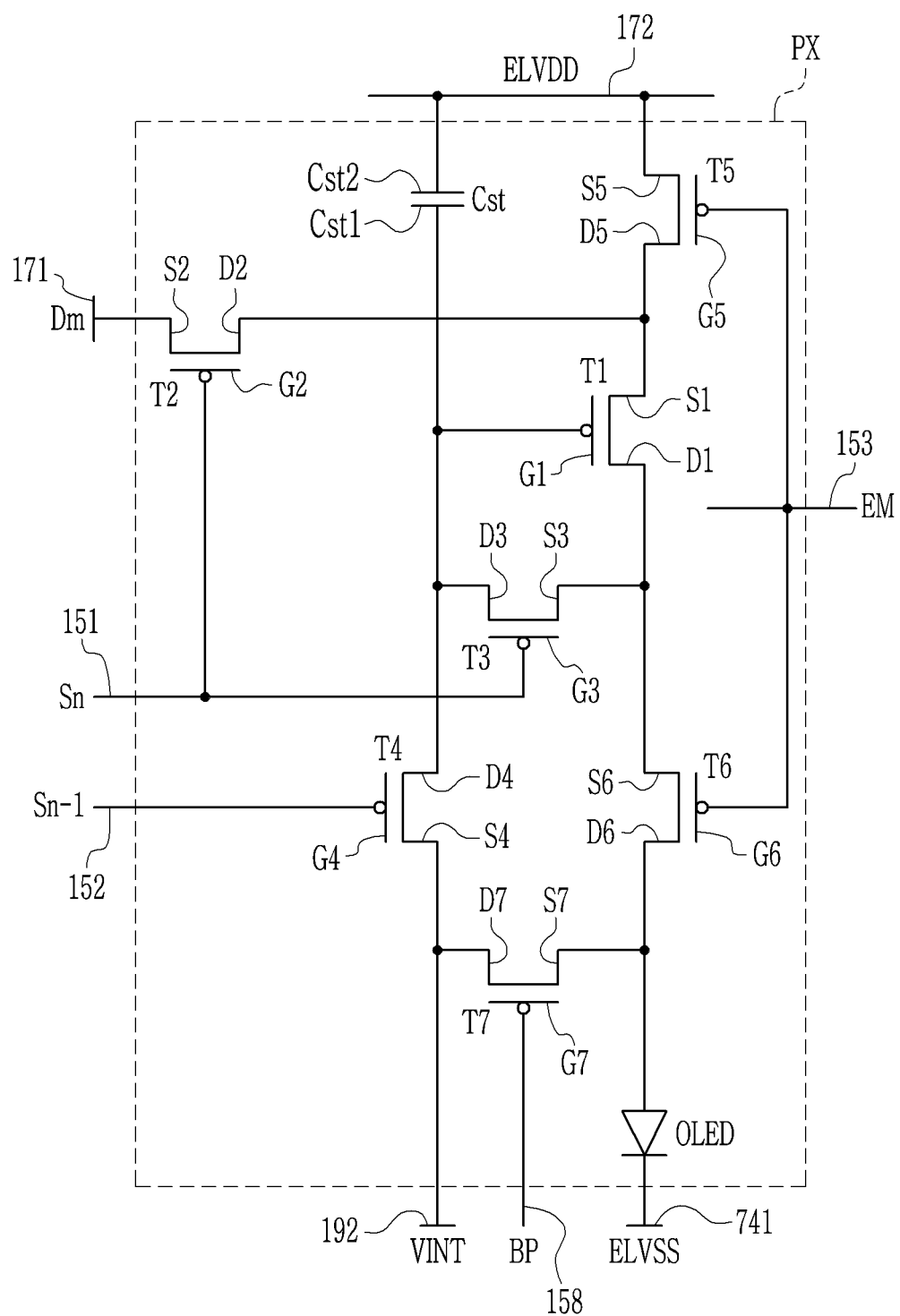
FIG. 14 is an equivalent circuit diagram illustrating one pixel of a display device according to an exemplary embodiment.
Figure 15:
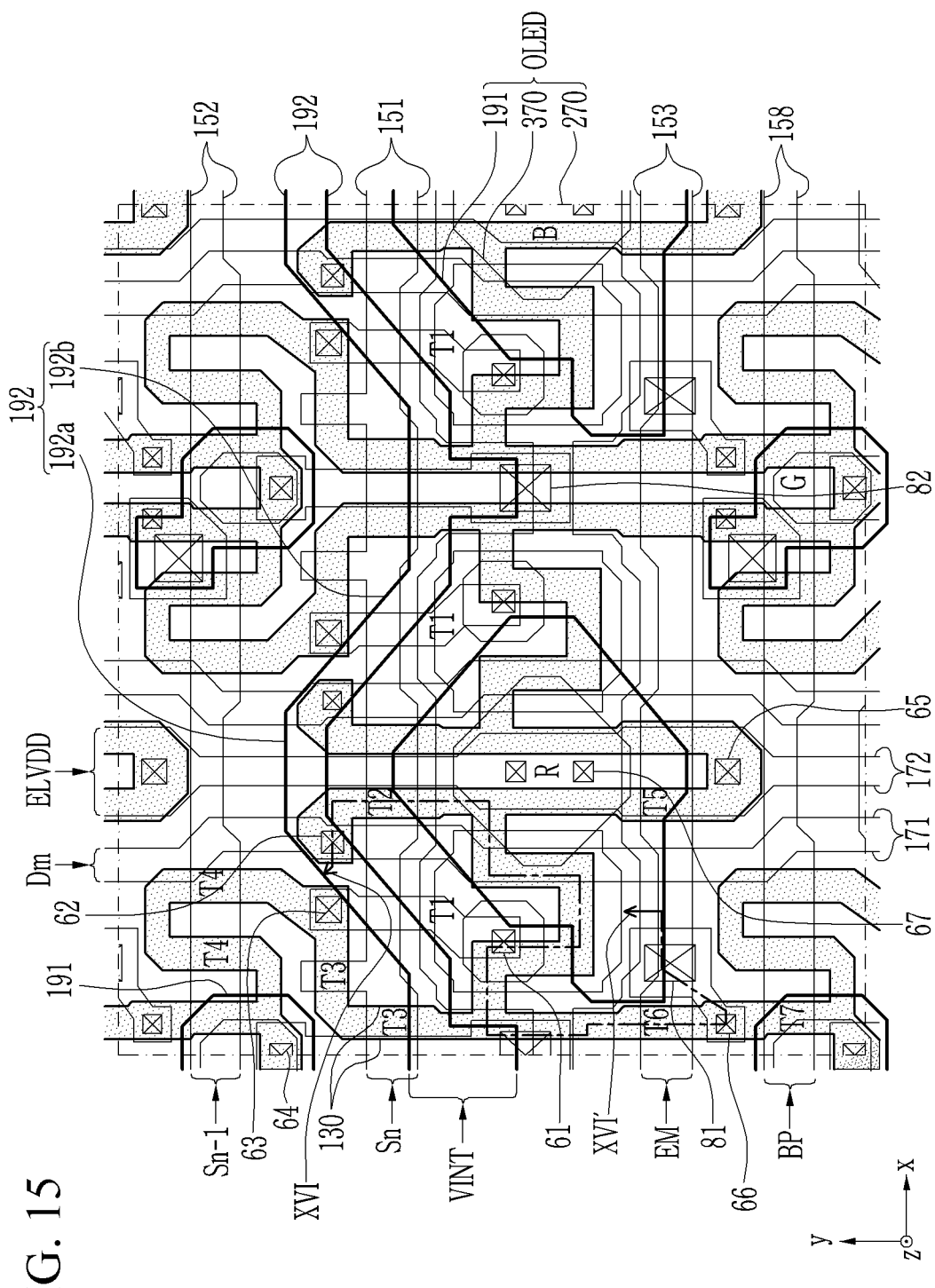
FIG. 15 is a layout view of pixels of a display device according to an exemplary embodiment.
Figure 16:
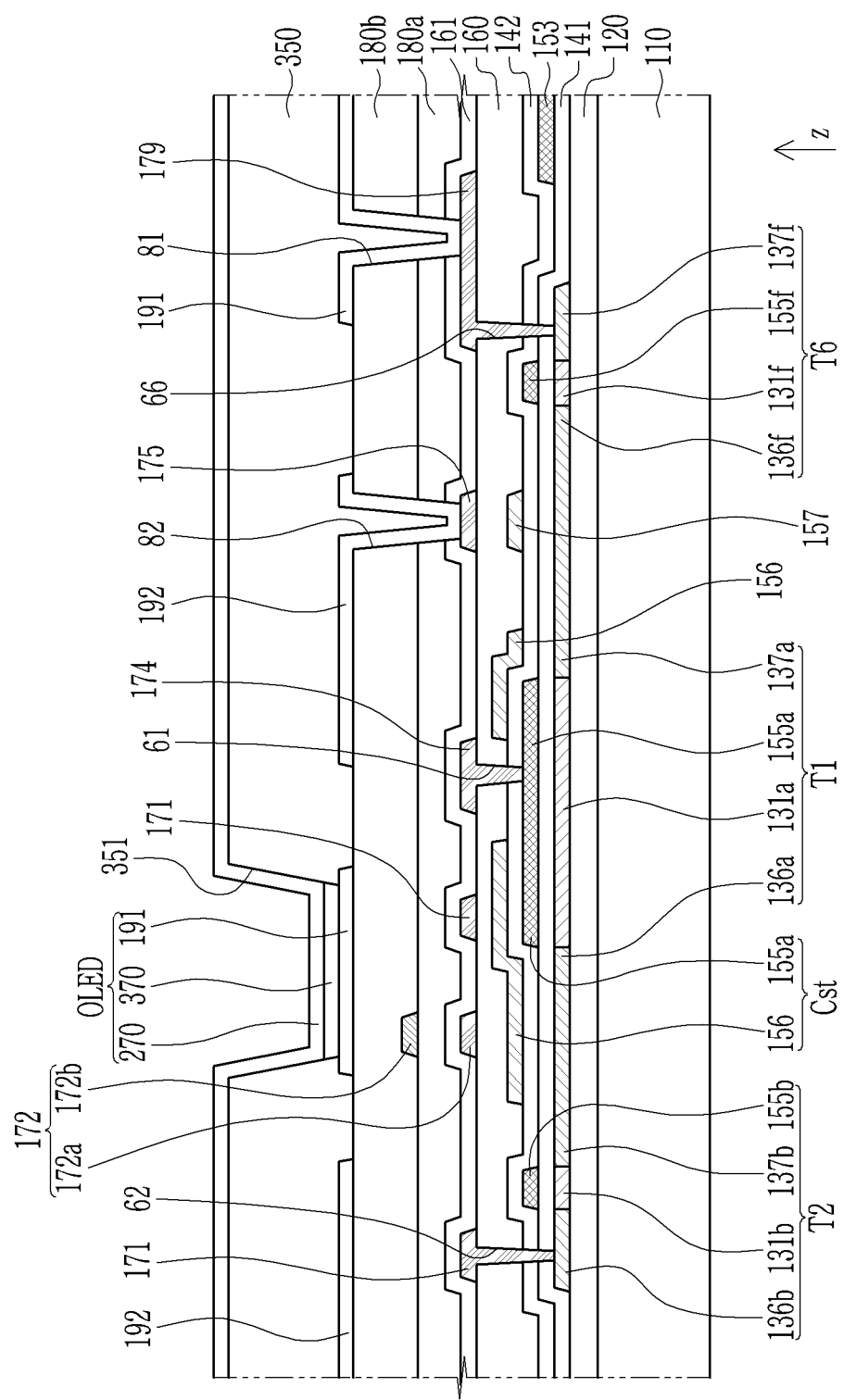
FIG. 16 is a cross-sectional view taken along line XVI-XVI' in FIG. 15.

FIG. 14 is an equivalent circuit diagram illustrating one pixel of a display device according to an exemplary embodiment, FIG. 15 is a layout view of pixels of a display device according to an exemplary embodiment, and FIG. 16 is a cross-sectional view taken along line XVI-XVI' in FIG. 15.

Referring to FIG. 14, according to the display device of the present exemplary embodiment, each pixel PX positioned in the display area DA includes a storage capacitor Cst, an organic light emitting diode OLED, and transistors T1 to T7 connected with display signal lines 151, 152, 153, 158, 171, 172, and 192.

The transistors T1 to T7 may include a driving transistor T1, a switching transistor T2, a compensation transistor T3, an initialization transistor T4, an operation control transistor T5, a light emission control transistor T6, and a bypass transistor T7.

The display signal lines 151, 152, 153, 158, 171, 172, and 192 may include a scan line 151, a previous-stage scan line 152, an emission control line 153, a bypass control line 158, a data line 171, a driving voltage line 172, and an initialization voltage line 192. The scan line 151 and the previous-stage scan line 152 may be connected with scan signal generating circuits of the aforementioned scan drivers SDa and SDb to receive a scan signal Sn and a previous-stage scan signal S(n−1), and the emission control line 153 may be connected with emission control signal generating circuits of the aforementioned emission drivers EDa and EDb to receive an emission control signal EM.

The previous-stage scan line 152 transfers the previous-stage scan signal S(n−1) to the initialization transistor T4, the emission control line 153 transfers the emission control signal EM to the operation control transistor T5 and the emission control transistor T6, and the bypass control line 158 transfers the bypass signal BP to the bypass transistor T7.

The data line 171 may receive a data signal Dm outputted from the integrated circuit chip 30, and the driving voltage line 172 and the initialization voltage line 192 may respectively receive a driving voltage ELVDD and an initialization voltage VINT through the pads of the first pad region PA1. The initialization voltage VINT initializes the driving transistor T1.

A gate electrode G1 of the driving transistor T1 is connected with a first electrode Cst1 of the storage capacitor Cst. A source electrode S1 of the driving transistor T1 is connected with the driving voltage line 172 via the operation control transistor T5. A drain electrode D1 of the driving transistor T1 is connected with an anode of the organic light emitting diode OLED via the emission control transistor T6.

A gate electrode G2 of the switching transistor T2 is connected with the scan line 151. A source electrode S2 of the switching transistor T2 is connected with the data line 171. A drain electrode D2 of the switching transistor T2 is connected with the source electrode S1 of the driving transistor T1 and is connected with the driving voltage line 172 via the operation control transistor T5.

A gate electrode G3 of the compensation transistor T3 is connected with the scan line 151. A source electrode S3 of the compensation transistor T3 is connected with the drain electrode D1 of the driving transistor T1 and is connected with an anode of the organic light emitting diode OLED via the emission control transistor T6. A drain electrode D3 of the compensation transistor T3 is connected with a drain electrode D4 of the initialization transistor T4, the first electrode Cst1 of the storage capacitor Cst, and the gate electrode G1 of the driving transistor T1.

A gate electrode G4 of the initialization transistor T4 is connected with the previous-stage scan line 152. A source electrode S4 of the initialization transistor T4 is connected with the initialization voltage line 192. The drain electrode D4 of the initialization transistor T4 is connected with the first electrode Cst1 of the storage capacitor Cst and the gate electrode G1 of the driving transistor T1 via the drain electrode D3 of the compensation transistor T3.

A gate electrode G5 of the operation control transistor T5 is connected with the emission control line 153. A source electrode S5 of the operation control transistor T5 is connected with the driving voltage line 172. A drain electrode D5 of the operation control transistor T5 is connected with the source electrode S1 of the driving transistor T1 and the drain electrode D2 of the switching transistor T2.

A gate electrode G6 of the emission control transistor T6 is connected with the emission control line 153. A source electrode S6 of the emission control transistor T6 is connected with the drain electrode D1 of the driving transistor T1 and the source electrode S3 of the compensation transistor T3. A drain electrode D6 of the emission control transistor T6 is connected with the anode of the organic light emitting diode OLED.

A gate electrode G7 of the bypass transistor T7 is connected with the bypass control line 158. A source electrode S7 of the bypass transistor T7 is connected with the drain electrode D6 of the emission control transistor T6 and the anode of the organic light emitting diode OLED. A drain electrode D7 of the bypass transistor T7 is connected with the initialization voltage line 192 and the source electrode S4 of the initialization transistor T4.

A second electrode Cst2 of the storage capacitor Cst is connected with the driving voltage line 172. A cathode of the organic light emitting diode OLED is connected with a common voltage line 741 for transferring the common voltage ELVSS. The common voltage line 741 or the cathode receives the common voltage ELVSS which can be inputted through the pads of the first pad region PA1.

The circuit structure of the pixel PX is not limited to that illustrated in FIG. 14, and numbers of the transistors and the capacitors and the connections thereof may be variously changed.

Referring to FIG. 15, a pixel area including a red pixel R, a green pixel G, and a blue pixel B, as an example, is illustrated. In the display panel 10, the pixels R, G, and B may be arranged in a matrix.

The scan line 151, the previous-stage scan line 152, the emission control line 153, and the bypass control line 158 which respectively transfer the scan signal Sn, the previous-stage scan signal S(n−1), the emission control signal EM, and the bypass signal BP extend substantially in the first direction x. The bypass control line 158 may be the same as the previous-stage scan line 152. The data line 171 and the driving voltage line 172 which respectively transfer the data signal Dm and the driving voltage ELVDD extend substantially in the second direction y. In the initialization voltage line 192 for transferring the initialization voltage VINT, a parallel portion 192a that is substantially parallel with the first direction x and an inclined portion 192b that is inclined with respect thereto alternatively extend.

The driving transistor T1, the switching transistor T2, the compensation transistor T3, the initialization transistor T4, the operation control transistor T5, the emission control transistor T6, the bypass transistor T7, the storage capacitor Cst, and the organic light emitting diode OLED may be formed as illustrated in FIG. 15.

The organic light emitting diode OLED is formed to include a pixel electrode 191, an organic emission layer 370, and a common electrode 270. The compensation transistor T3 and the initialization transistor T4 may have a dual gate structure for blocking a leakage current.

Each channel of the driving transistor T1, the switching transistor T2, the compensation transistor T3, the initialization transistor T4, the operation control transistor T5, the emission control transistor T6, and the bypass transistor T7 is positioned in one semiconductor layer 130. The semiconductor layer 130 may be bent in various shapes.

A cross-sectional structure of the display area DA will be described focusing on some transistors T1, T2, and T6 and the storage capacitor Cst with reference to FIG. 15 and FIG. 16.

The display panel 10 includes a substrate 110 and layers formed thereon. The substrate 110 may be a flexible substrate formed of a polymer such as polyimide, polyamide, polyethylene terephthalate, and polycarbonate. The substrate 110 may include a barrier layer for preventing diffusion of impurities that deteriorate semiconductor characteristics and preventing penetration of moisture or the like. The substrate 110 may be a rigid substrate made of glass or the like.

A buffer layer 120 is positioned on the substrate 110. The buffer layer 120 may serve to block impurities capable of diffusing from the substrate 110 to a semiconductor layer 130 during a process of forming the semiconductor layer 130, and may serve to reduce stress applied to the substrate 110. The buffer layer 120 may include an inorganic insulating material such as a silicon oxide (SiOx) and a silicon nitride (SiNx).

The semiconductor layer 130 including a driving channel 131a, a switching channel 131b, an emission control channel 131f, and the like is positioned on the buffer layer 120. The semiconductor layer 130 may include a polysilicon, an oxide semiconductor, or amorphous silicon.

In the semiconductor layer 130, a driving source electrode 136a and a driving drain electrode 137a are positioned at opposite sides of the driving channel 131a, and a switching source electrode 136b and a switching drain electrode 137b are positioned at opposite sides of the switching channel 131b. In addition, an emission control source electrode 136f and an emission control drain electrode 137f are positioned at opposite sides of the emission control channel 131f.

A first gate insulating layer 141 is positioned on the semiconductor layer 130. A first gate conductor, which includes the scan line 151, the previous-stage scan line 152, the emission control line 153, the bypass control line 158, and a driving gate electrode (first storage electrode) 155a, is positioned on the first gate insulating layer 141. The scan line 151 includes a switching gate electrode 155b, and the emission control line 153 includes an emission control gate electrode 155f. The first gate conductor may be formed by patterning one or more conductive layers together.

A second gate insulating layer 142 is positioned on the first gate conductor and the first gate insulating layer 141. A second gate conductor including a storage line 157 and a second storage electrode 156 is positioned on the second gate insulating layer 142. The second storage electrode 156 may be a portion expanded from the storage line 157. The second storage electrode 156 constitutes a storage capacitor Cst together with the first storage electrode 155a. The first and second gate conductors may include a metal such as molybdenum (Mo), copper (Cu), aluminum (Al), silver (Ag), chromium (Cr), tantalum (Ta), titanium (Ti), and a metal alloy thereof. The first and second gate insulating layers 141 and 142 may include an inorganic insulating material such as a silicon oxide and a silicon nitride.

An interlayer insulating layer 160 is positioned on the second gate insulating layer 142 and the second gate conductor. The interlayer insulating layer 160 may include an inorganic insulating material and/or an organic insulating material.

Contact holes 61 to 67 are positioned in the interlayer insulating layer 160. A first data conductor including the data line 171, a first voltage line 172a of the driving voltage line 172, a driving connecting member 174, an initialization connecting member 175, and a pixel connecting member 179 is positioned on the interlayer insulating layer 160. The data line 171 is connected with the switching source electrode 136b through the contact hole 62 formed in the insulating layers 141, 142, and 160. The driving connecting member 174 has a first end that is connected with the first storage electrode 155a through the contact hole 61 formed in the insulating layers 142 and 160, and a second end that is connected with a compensation drain electrode (not illustrated) and an initialization drain electrode (not illustrated) through the contact hole 63 formed in the insulating layers 141, 142, and 160. The initialization connecting member 175 is connected with an initialization source electrode (not illustrated) through the contact hole 64 formed in the insulating layers 141, 142, and 160. The pixel connecting member 179 is connected with the emission control drain electrode 137f through the contact hole 66 formed in the insulating layers 141, 142, and 160.

A passivation layer 161 is positioned on the first data conductor and the interlayer insulating layer 160, and a first planarization layer 180a is positioned on the passivation layer 161. A second data conductor including a second voltage line 172b of the driving voltage line 172 is positioned on the first planarization layer 180a. When the driving voltage line 172 is formed to include two voltage lines 172a and 172b, resistance of the driving voltage line 172 may be reduced to reduce a load effect, thereby preventing a luminance difference from occurring in the display area DA. The first and second data conductors may include a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), nickel (Ni), and a metal alloy thereof.

A second planarization layer 180b is positioned on the second conductor and the first planarization layer 180a. The first and second planarization layers 180a and 180b may include an organic material.

The pixel electrode 191 and the initialization voltage line 192 are positioned on the second planarization layer 180b. The pixel connecting member 179 is connected with the pixel electrode 191 through a contact hole 81 formed in the insulating layers 180a and 180b, and the initialization connecting member 175 is connected with the initialization voltage line 192 through a contact hole 82 formed in the insulating layers 180a and 180b.

A pixel definition layer 350 that overlaps the pixel electrode 191 and includes an opening 351 is positioned on the second planarization layer 180b. The pixel definition layer 350 may include an organic material such as a polyacryl-based resin or a polyimide-based resin.

The organic emission layer 370 is positioned on the pixel electrode 191, and the common electrode 270 is positioned on the organic emission layer 370. The common electrode 270 may also be positioned on the pixel definition layer 350 to be formed over the pixels. The pixel electrode 191, the organic emission layer 370, and the common electrode 270 constitute the organic light emitting diode OLED.

An encapsulation layer (not illustrated) for protecting the organic light emitting diode (OLED) may be positioned on the common electrode 270, and a polarization layer (not illustrated) for reducing reflection of external light may be positioned on the encapsulation layer Hereinafter, an exemplary cross-sectional structure of the lighting pads LP1 to LP7 of the pad portion PP will be described with reference to FIG. 17.

Figure 17:
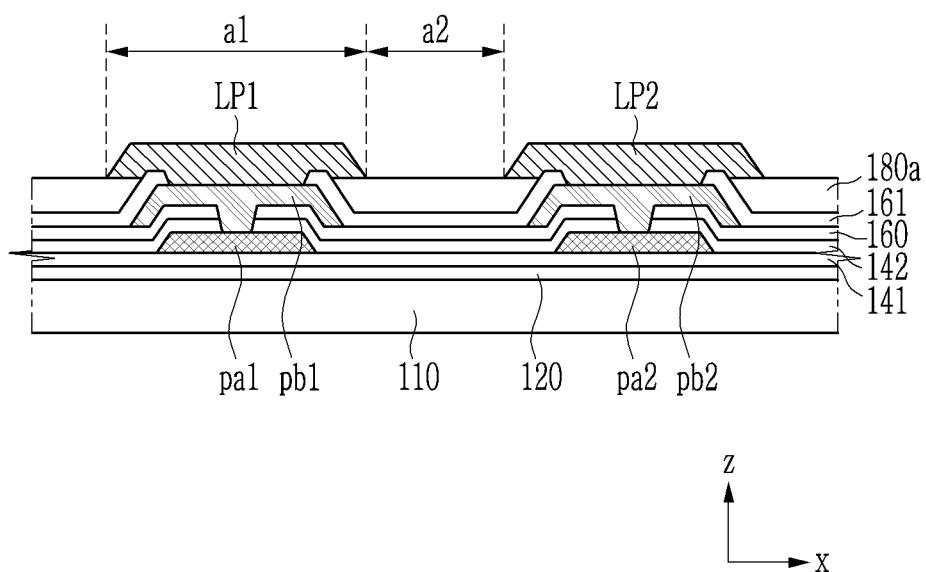
FIG. 17 is a cross-sectional view taken along XVII-XVII' in FIG. 3.

FIG. 17 is a cross-sectional view taken along XVII-XVII' in FIG. 3. In FIG. 17, a cross-section of the display panel 10 in which the lighting pads LP1 and LP2 illustrated in FIG. 3 are positioned is illustrated.

The lighting pads LP1 and LP2 may respectively have a structure in which overlapping first conductive layers pa1 and pb1 are connected and overlapping second conductive layers pa2 and pb2 are connected. Although the first and second conductive layers pa1, pb1, pa2, and pb2 are illustrated, more or less conductive layers than the illustrated conductive layers may be included. The first conductive layers pa1 and pa2 may be formed by using a same material in a same process as those of the first gate conductor. The second conductive layers pb1 and pb2 may be formed by using a same material in a same process as those of the first gate conductor. The lighting pads LP1 and LP2 may be formed by using a same material in a same process as those of the second gate conductor. Alternatively, the lighting pads LP1 and LP2 may be formed by using a same material in a same process as those of a conductor positioned in the display area DA, such as the first data conductor and the pixel electrode.

Insulating layers which are also positioned in the display area DA may be formed in the pad portion PP, and the buffer layer 120 and the first gate insulating layer 141 may be positioned between the substrate 110 and the first conductive layers pa1 and pa2. The second gate insulating layer 142 and the interlayer insulating layer 160 may be disposed between the first conductive layers pa1 and pa2 and the second conductive layers pb1 and pb2. The passivation layer 161 and the first planarization layer 180a may be positioned between the second conductive layers pb1 and pb2 and the lighting pads LP1 and LP2. The second conductive layers pb1 and pb2 may be connected with the first conductive layers pa1 and pa2 through contact holes formed in the second gate insulating layer 142 and the interlayer insulating layer 160, and the lighting pads LP1 and LP2 may be connected with the second conductive layers pb1 and pb2 through contact holes formed in the passivation layer 161 and the first planarization layer 180a. The lighting pads LP1 and LP2 may be connected with the dummy pads of the flexible printed circuit film 20 directly or through the conductive particles CP. The lighting pads LP1 and LP2 may be electrically connected to a scan driver SDa, an emission driver EDa, and/or a crack detection circuit MCD through signal transfer lines connected with the first conductive layers pa1 and pa2 and/or the second conductive layers pb1 and pb2.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:
1. A display device comprising:
a display panel including a pad portion; and
a flexible printed circuit film bonded to the pad portion,
wherein the pad portion includes lighting pads positioned in at least one end thereof,
the flexible printed circuit film includes dummy pads positioned at a portion corresponding to the lighting pads to overlap at least some of the lighting pads,
a number of the dummy pads is smaller than a number of the lighting pads, and
a pitch of the dummy pads is greater than a pitch of the lighting pads.

2. The display device of claim 1, wherein the pitch of the dummy pads is twice or more than the pitch of the lighting pads.

3. The display device of claim 2, wherein, among the lighting pads, lighting pads overlapping the dummy pads and lighting pads that do not overlap the dummy pads are alternately positioned along a first direction corresponding to a longitudinal direction of the pad portion.

4. The display device of claim 1, wherein the pad portion includes an alignment mark between the lighting pads and pads adjacent thereto.

5. The display device of claim 4, wherein the flexible printed circuit film includes an alignment mark between the dummy pads and pads adjacent thereto.

6. The display device of claim 5, wherein the lighting pads are rectangular and have long sides that are perpendicular to a first direction corresponding to a longitudinal direction of the pad portion, and
the pads adjacent to the lighting pads are parallelogrammic and have long sides that are inclined with respect to the first direction.

7. The display device of claim 6, wherein the dummy pads are rectangular and have long sides that are perpendicular to the longitudinal direction of the pad portion, and
the pads adjacent to the dummy pads are parallelogrammic and have long sides that are inclined with respect to the longitudinal direction of the pad portion.

8. The display device of claim 1, wherein a width of the lighting pads and a width of the dummy pads are substantially the same.

9. The display device of claim 1, wherein a length of the lighting pads and a length of the dummy pads are substantially the same.

10. The display device of claim 1, wherein the pad portion and the flexible printed circuit film are bonded to each other by an anisotropic conductive film including conductive particles.

11. A display device comprising:
a display panel including a pad portion; and
a flexible printed circuit film bonded to the pad portion, wherein the pad portion includes lighting pads positioned in at least one end thereof,
the flexible printed circuit film includes dummy pads corresponding to the lighting pads,
the dummy pads are arranged in at least two rows, and
a pitch of the dummy pads is greater than a pitch of the lighting pads.

12. The display device of claim 11, wherein a number of the dummy pads is equal to a number of the lighting pads.

13. The display device of claim 11, wherein each of the lighting pads includes a relatively wide first portion and a relatively narrow second portion, and the dummy pads overlap the first portions of the lighting pads.

14. The display device of claim 13, wherein the first portions and the second portions of the lighting pads are alternately positioned along a first direction corresponding to a longitudinal direction of the pad portion.

15. The display device of claim 13, wherein a length of each of the first portions is shorter than a length of each of the second portions.

16. The display device of claim 13, wherein a width of each of the first portions and a width of each of the dummy pads are substantially the same.

17. The display device of claim 13, wherein a length of each of the first portions and a length of each of the dummy pads are substantially the same.

18. The display device of claim 11, wherein the dummy pads include dummy pads positioned at a first row and dummy pads positioned at a second row, the pitch of the dummy pads positioned at the first row is the same as the pitch of the dummy pads positioned at the second row, and the pitch of the dummy pads positioned at the first row is twice the pitch of the lighting pads.

19. The display device of claim 11, wherein some of the lighting pads include a relatively wide first portion and a relatively narrow second portion, while others of the lighting pads include the first portion but include no second portion, and the dummy pads overlap the first portions of the lighting pads.

* * * * *